(12) United States Patent
Gu et al.

(10) Patent No.: US 11,114,466 B2
(45) Date of Patent: Sep. 7, 2021

(54) IC PRODUCTS FORMED ON A SUBSTRATE HAVING LOCALIZED REGIONS OF HIGH RESISTIVITY AND METHODS OF MAKING SUCH IC PRODUCTS

(71) Applicant: GLOBALFOUNDRIES U.S. Inc., Santa Clara, CA (US)

(72) Inventors: Sipeng Gu, Clifton Park, NY (US); Jiehui Shu, Clifton Park, NY (US); Haiting Wang, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/774,087

(22) Filed: Jan. 28, 2020

(65) Prior Publication Data
US 2021/0233934 A1 Jul. 29, 2021

(51) Int. Cl.
| | |
|---|---|
| *H01L 27/12* | (2006.01) |
| *H01L 21/762* | (2006.01) |
| *H01L 21/306* | (2006.01) |
| *H01L 21/84* | (2006.01) |
| *H01L 21/265* | (2006.01) |
| *H01L 21/76* | (2006.01) |

(52) U.S. Cl.
CPC ...... *H01L 27/1203* (2013.01); *H01L 21/7624* (2013.01); *H01L 21/84* (2013.01); *H01L 21/26506* (2013.01); *H01L 21/30604* (2013.01); *H01L 21/76* (2013.01)

(58) Field of Classification Search
CPC . H01L 27/1203; H01L 21/7624; H01L 21/84; H01L 21/26506; H01L 21/30604; H01L 29/7378; H01L 21/76
USPC ........ 257/506, 510; 438/207, 218, 219, 294, 438/427
See application file for complete search history.

(56) References Cited

U.S. PATENT DOCUMENTS

2014/0001608 A1* 1/2014 McPartlin ............... H01L 21/76
257/656

FOREIGN PATENT DOCUMENTS

| EP | 1734575 A1 | 12/2006 |
|---|---|---|
| EP | 1744357 A2 | 1/2007 |

* cited by examiner

*Primary Examiner* — Thinh T Nguyen
(74) *Attorney, Agent, or Firm* — Hoffman Warnick LLC

(57) ABSTRACT

One illustrative IC product disclosed herein includes an (SOI) substrate comprising a base semiconductor layer, a buried insulation layer and an active semiconductor layer positioned above the buried insulation layer. In this particular example, the IC product also includes a first region of localized high resistivity formed in the base semiconductor layer, wherein the first region of localized high resistivity has an electrical resistivity that is greater than an electrical resistivity of the material of the base semiconductor layer. The IC product also includes a first region comprising integrated circuits formed above the active semiconductor layer, wherein the first region comprising integrated circuits is positioned vertically above the first region of localized high resistivity in the base semiconductor layer.

20 Claims, 12 Drawing Sheets

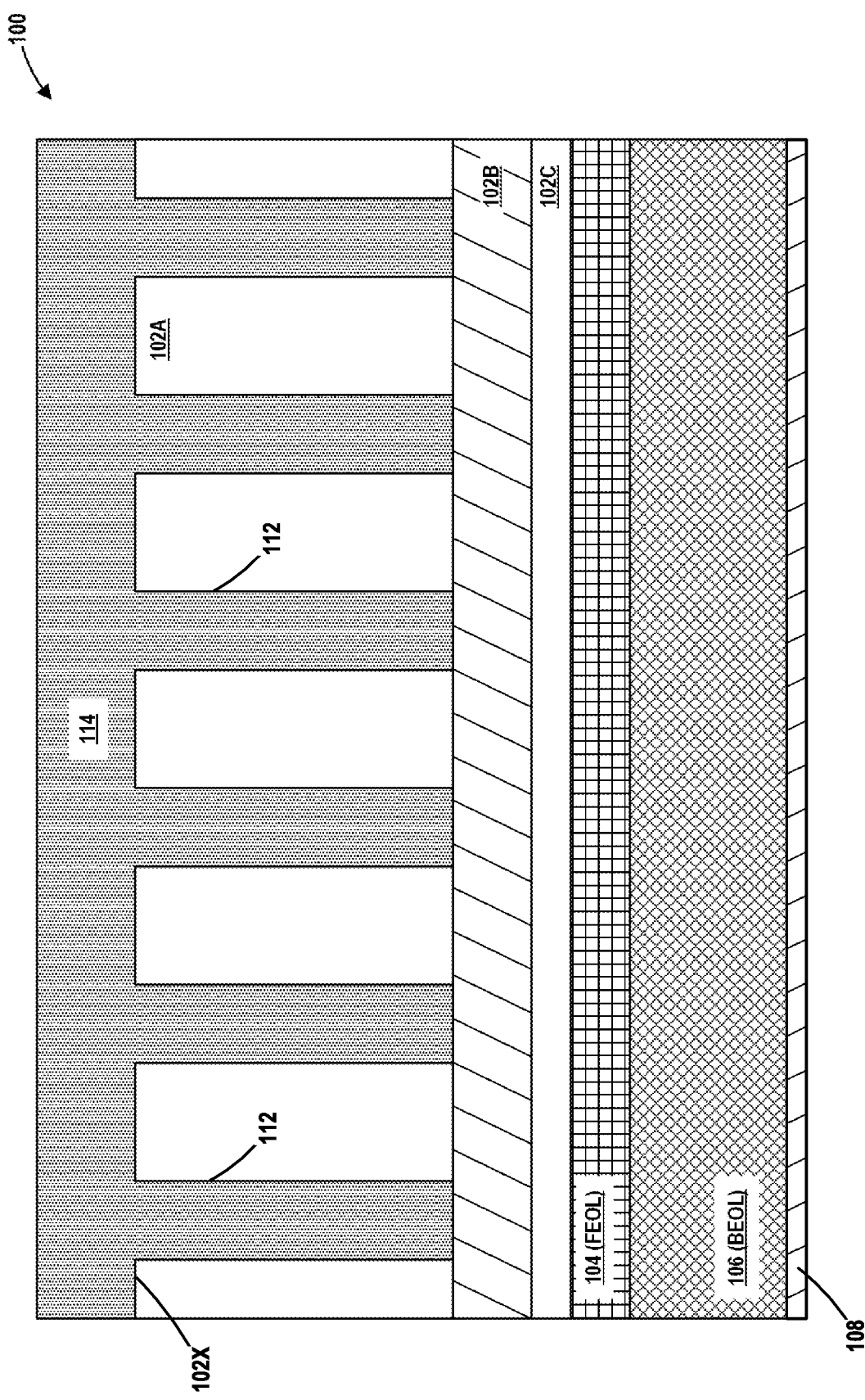

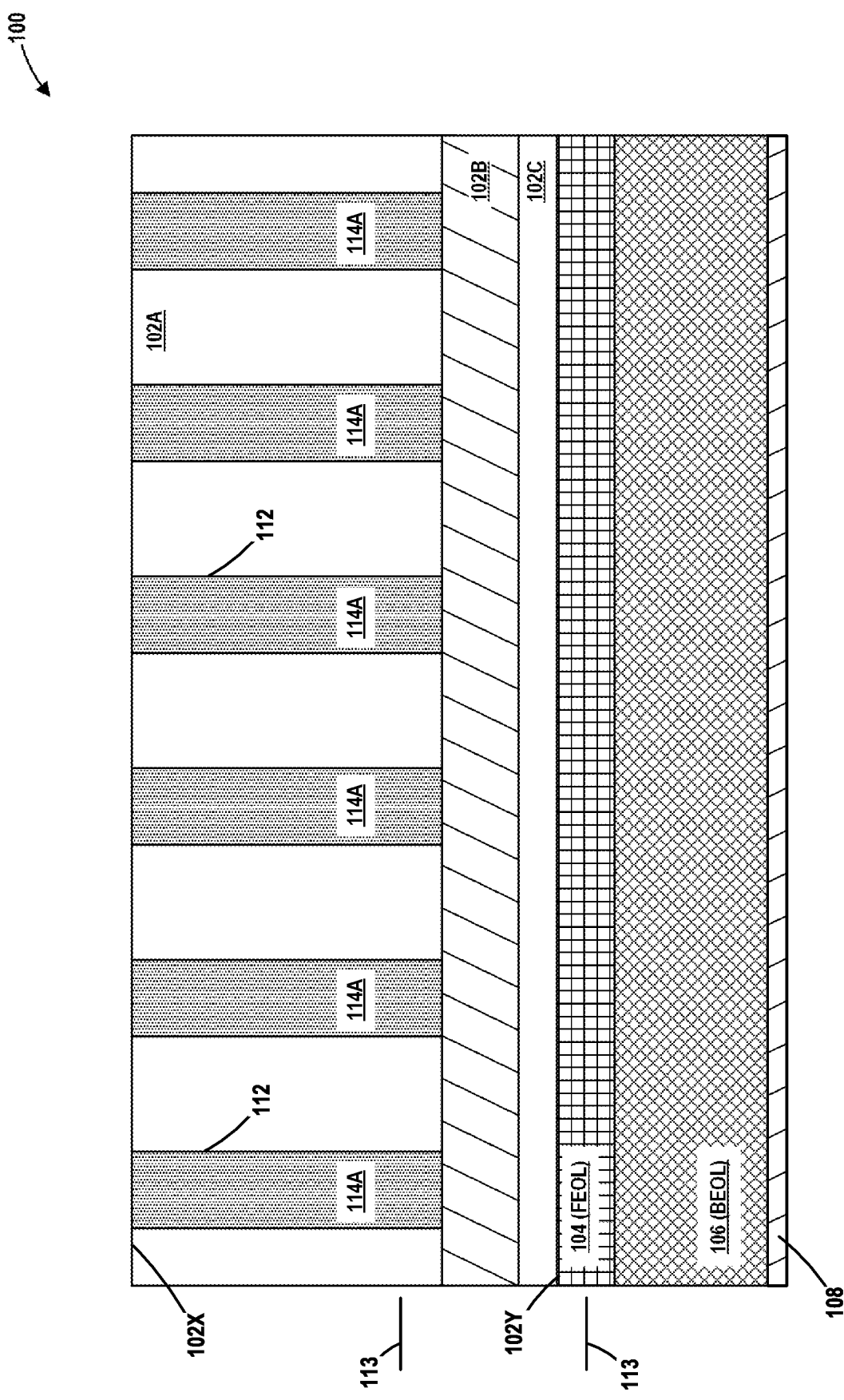

IC PRODUCTS FORMED ON A SUBSTRATE HAVING LOCALIZED REGIONS OF HIGH RESISTIVITY AND METHODS OF MAKING SUCH IC PRODUCTS

BACKGROUND

Field of the Invention

The present disclosure generally relates to various embodiments of novel integrated circuit (IC) products formed on a substrate that comprises localized regions of high resistivity and methods of making such IC products.

Description of the Related Art

Some modern IC products include radio frequency (RF) circuits. Such IC products are typically formed on a semiconductor-on-insulator (SOI) substrate. An SOI substrate includes a base semiconductor layer, a buried insulation layer positioned on the base semiconductor layer and an active semiconductor layer positioned on the buried insulation layer. Semiconductor devices, e.g., transistors, resistors, capacitors, etc., are formed in and above the active semiconductor layer.

The performance of RF circuits is improved when the base semiconductor layer of the SOI substrate has a relatively higher resistivity as compared to the resistivity of the base semiconductor layer of SOI substrates that are used when forming traditional CMOS circuits. For example, forming RF circuits over a base semiconductor layer substrate having a relatively high resistivity may reduce the eddy current losses for the RF circuit. One technique that has been employed to form such high resistivity substrates involves use of the float-zone crystal growth method, or post-implanting a neutral species in the entire base semiconductor layer to form highly damaged layers with high trap density in the bandgap. However, manufacturing integrated circuits on such high resistivity substrates can lead to some problems. For example, some of the implanted material in the base semiconductor layer may migrate into various semiconductor devices, e.g., transistors, that are formed above the active semiconductor layer. As one example, during the formation of the various devices on the IC product, the substrate may be exposed to one or more relatively high temperature anneal processes that may cause the implanted material in the base semiconductor layer to migrate to undesired locations. Moreover, there is a higher chance for arcing during BEOL (back end of line) etching processes due to charge buildup when using such high resistivity substrates.

The present disclosure is generally directed to various embodiments of novel IC products formed on a substrate that comprise localized regions of high resistivity and methods of making such IC products.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of novel IC products formed on a substrate that comprise localized regions of high resistivity and methods of making such IC products. One illustrative IC product disclosed herein includes a semiconductor-on-insulator (SOI) substrate comprising a base semiconductor layer, a buried insulation layer positioned above the base semiconductor layer and an active semiconductor layer positioned above the buried insulation layer. In this particular example, the IC product also includes a first region of localized high resistivity formed in the base semiconductor layer, wherein the first region of localized high resistivity has an electrical resistivity that is greater than an electrical resistivity of the material of the base semiconductor layer. The IC product also includes a first region comprising integrated circuits formed above the active semiconductor layer, wherein the first region comprising integrated circuits is positioned vertically above the first region of localized high resistivity in the base semiconductor layer.

BRIEF DESCRIPTION OF THE DRAWINGS

The disclosure may be understood by reference to the following description taken in conjunction with the accompanying drawings, in which like reference numerals identify like elements, and in which:

FIGS. 1-14 depict various embodiments of novel IC products formed on a substrate that comprise localized regions of high resistivity and methods of making such IC products. It should be noted that the attached drawings are not to scale.

Figure 1:
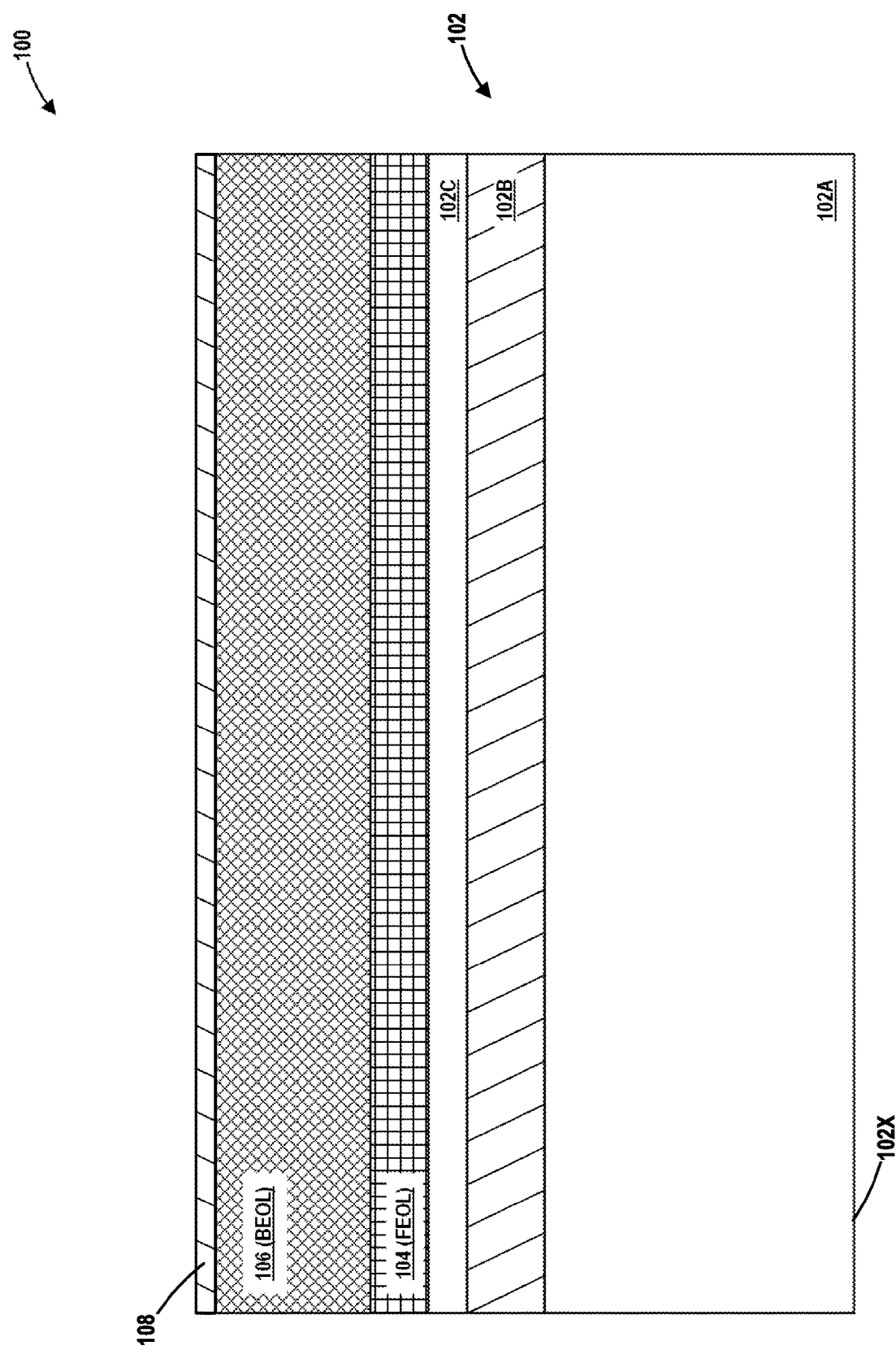

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-14 depict various embodiments of novel IC products 100 formed on a substrate 102 that comprise localized regions of high resistivity and methods of making such IC products. In the examples depicted herein, the IC product 100 will be formed above a semiconductor substrate 102. The substrate 102 may have a variety of configurations, such as a semiconductor-on-insulator (SOI) shown in FIG. 1. Such an SOI substrate 102 includes a base semiconductor layer 102A, a buried insulation layer 102B positioned on the base semiconductor layer 102A and an active semiconductor layer 102C positioned above the buried insulation layer 102B, wherein the active (e.g., transistors, etc.) and passive (e.g., resistors, capacitors, etc.) semiconductor devices will be formed in and above the active semiconductor layer 102C. As depicted, the base semiconductor layer 102A has a bottom surface 102X. The thicknesses of the base semiconductor layer 102A, the buried insulation layer 102B and the active semiconductor layer 102C may all vary depending upon the particular applications, e.g., 600-900 µm, 150-3000 nm and 30-200 nm, respectively, based upon current-day technology. The base semiconductor layer 102A and the active semiconductor layer 102C may be made of a variety of different semiconductor materials, e.g., silicon, SiGe, a III-V material, etc., and the base semiconductor layer 102A and the active semiconductor layer 102C need not be made of the same semiconductor material, but that may be the case in some applications.

One illustrative technique for forming the localized regions of high resistivity in the base semiconductor layer 102A will now be described with reference to FIGS. 1-9. FIG. 1 depicts the IC product 100 after all FEOL (front end of line) processing activities and structures 104 and all BEOL (back end of line) processing activities and structures 106 were performed. As depicted, the FEOL structures 104 and the BEOL structures 106 were formed above the upper surface of the active semiconductor layer 102C. No attempt has been made in FIG. 1 to show the individual semiconductor devices, e.g., transistors, capacitors, resistors, etc., that are part of the FEOL structures 104 or the individual conductive lines and individual conductive vias that are part of the BEOL structures 106. As depicted, at this point in the process flow, a simplistically depicted and representative metallization/passivation layer 108 was formed above the BEOL structures 106. The substrate 102 is at the point in processing where it would otherwise be ready for dicing, i.e., separating the individual die formed in and above the active semiconductor layer 102C. However, in some applications, the original thickness of the base semiconductor layer 102A may have been reduced at this point in the process flow. In one illustrative example, the IC products 100 disclosed herein comprise RF circuits and perhaps other forms of circuits, e.g., logic circuits, memory circuits, etc., and the IC products disclosed herein may be employed in any application that involves formation and use of RF circuits. However, the present subject matter should not be considered to be limited to only IC products that include RF circuitry.

Figure 2:
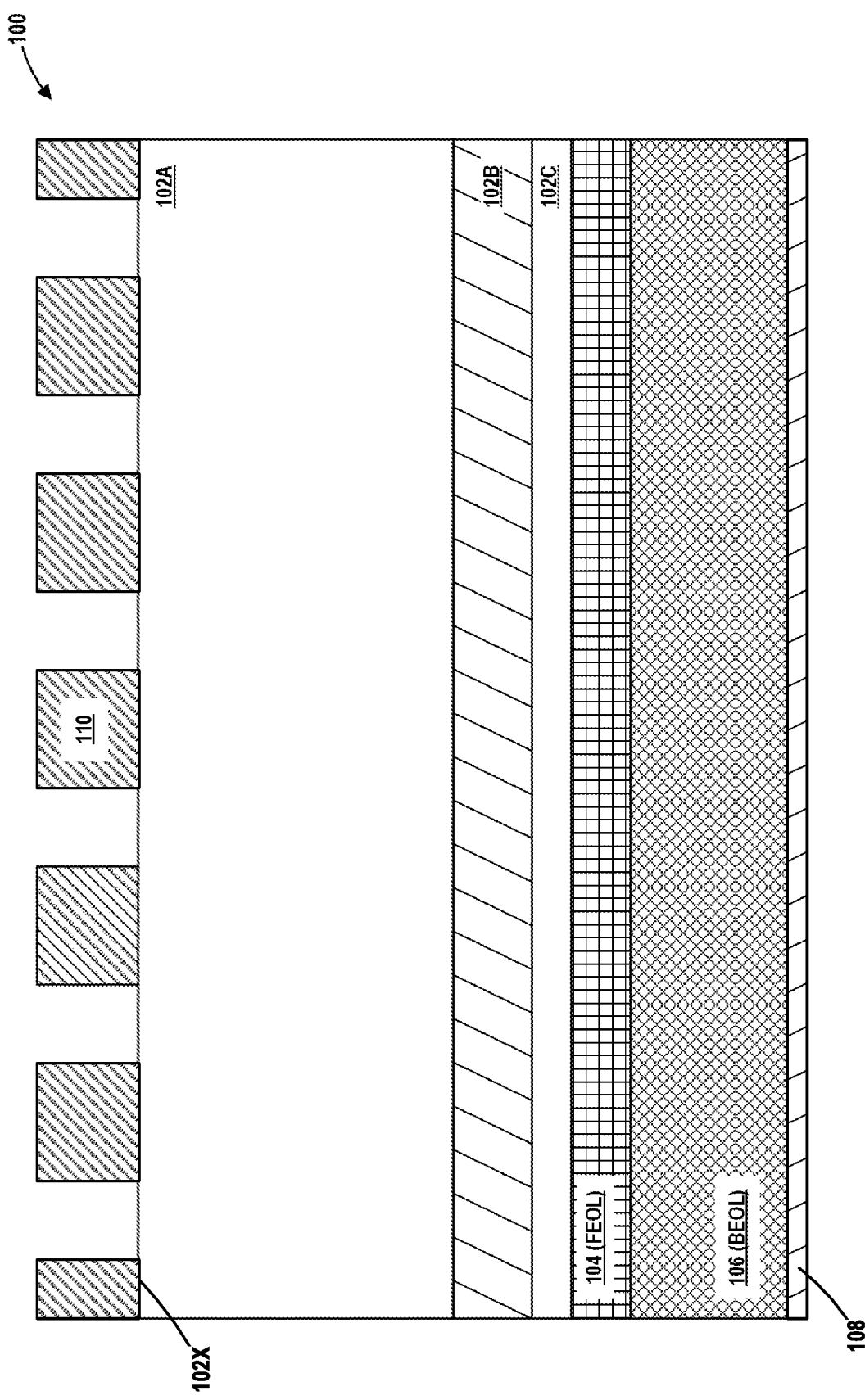

FIG. 2 depicts the IC product 100 after several steps were performed. First, the IC product was flipped such that the bottom surface 102X of the base semiconductor layer 102A is facing upward. Next, a patterned etch mask layer 110, with a plurality of openings therein, was formed above the bottom surface 102X of the base semiconductor layer 102A. The patterned etch mask layer 110 may take a variety of forms and may be comprised of a variety of different materials e.g., photoresist, OPL, etc. The patterned etch mask layer 110 may be formed by performing known techniques.

Figure 3:
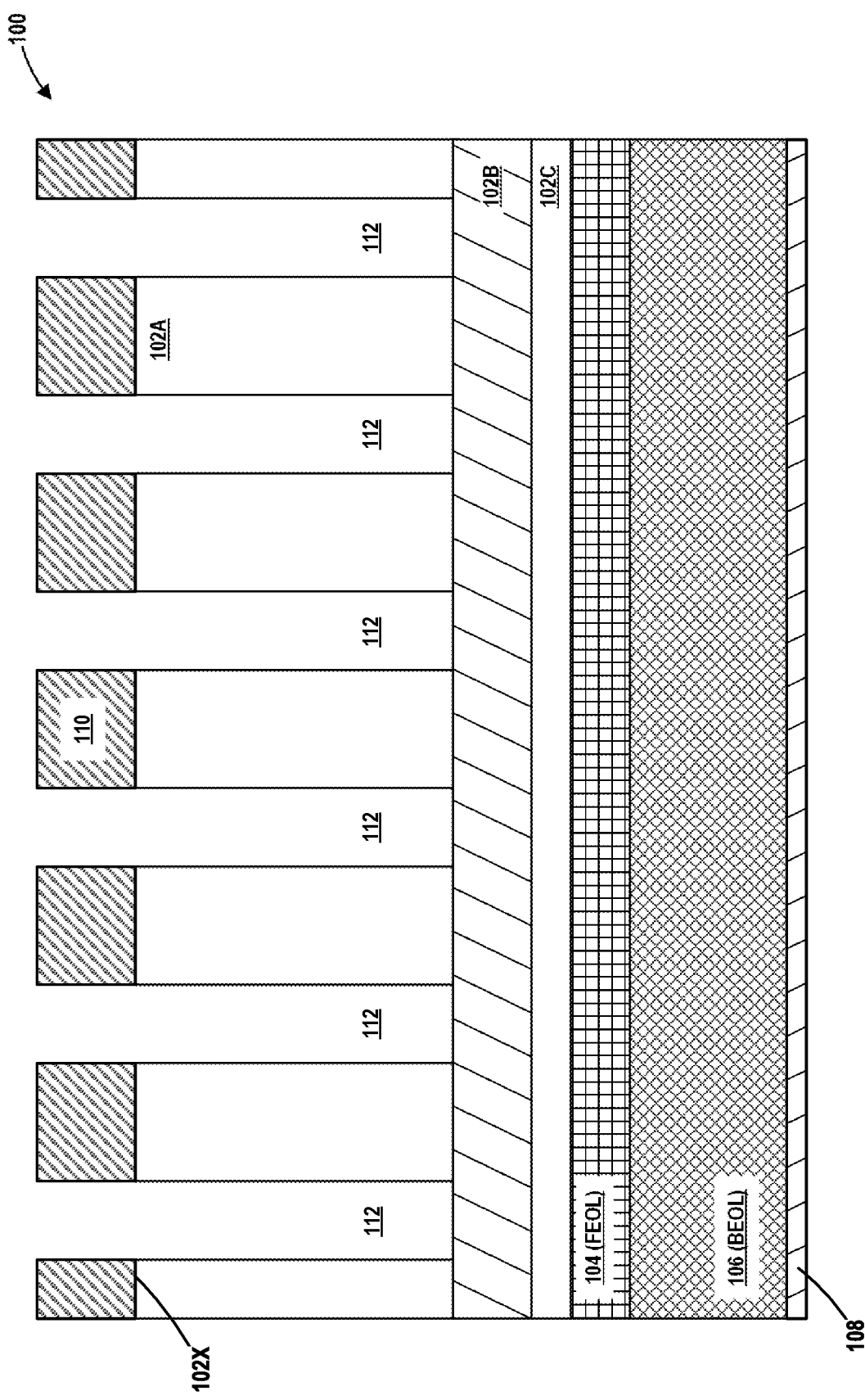

FIG. 3 depicts the IC product 100 after an etching process, e.g., an anisotropic etching process, was performed to form a plurality of openings 112 in the base semiconductor layer 102A. As depicted, the openings 112 extend all the way through the base semiconductor layer 102A to the interface between the base semiconductor layer 102A and the buried insulation layer 102B, i.e., the openings 112 expose portions of the buried insulation layer 102B. In general, the size, shape and configurations of the openings 112 may vary depending upon the particular application. More specifically, in one embodiment and as discussed more fully below, the size, shape and configurations of the openings 112 may vary depending upon the location and configuration of the regions on the IC product that contain the RF circuits.

FIG. 4 depicts the IC product 100 after several steps were performed. First, the patterned etch mask layer 110 was removed. Thereafter, a layer of insulating material 114 was blanket-deposited on the IC product 100 by performing, for example, a chemical vapor deposition (CVD) process. As depicted, the layer of insulating material substantially overfills the openings 112. The layer of insulating material 114 may be comprised of a variety of different materials, e.g., silicon dioxide, silicon nitride, a high-k material (a material having a k value of about 7.0 or greater), $HfO_x$, $Al_2O_3$, $Ta_2O_3$, $TiO_2$, $BASrTiO_3$, $BzF_2$, $CaF_2$, $SrF_2$, etc.

FIG. 5 depicts the IC product 100 after a planarization process, e.g., a chemical mechanical planarization (CMP) process and/or an etch-back process operation, was performed to remove portions of the layer of insulating material 114 positioned outside of the openings 112. This process operation exposes the bottom surface 102X of the base semiconductor layer 102A. This process operations also results in the formation of a plurality of spaced-apart high-resistivity plugs 114A in the base semiconductor layer 102A of the substrate 102. The high-resistivity plugs 114A comprise a material, e.g., silicon dioxide, that has an electrical resistivity that is greater than the electrical resistivity of the material, e.g., silicon, of the base semiconductor layer 102A. The high-resistivity plugs 114A constitute spaced-apart and localized regions of relatively high resistivity material within the base semiconductor layer 102A. The high-resistivity plugs 114A will be formed in the base semiconductor layer 102A at various locations across the base semiconductor layer 102A, i.e., below the location of the regions of RF circuits formed in the FEOL structures 104 formed above the active semiconductor layer 102C.

Figure 8:
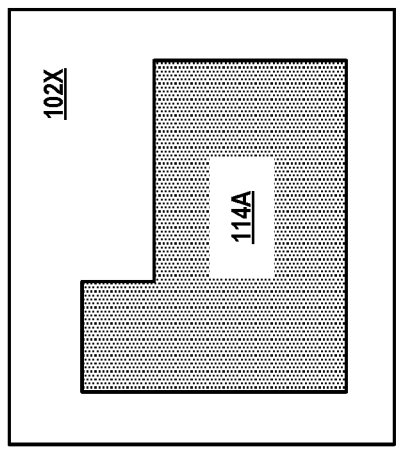
Figure 7:
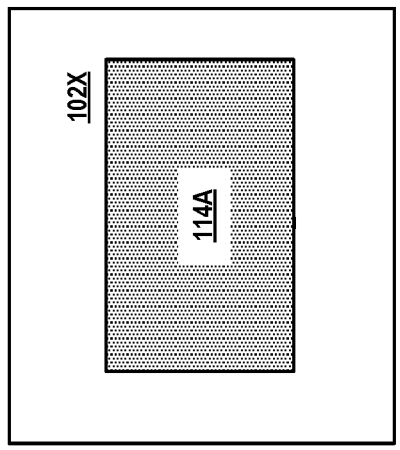
Figure 6:
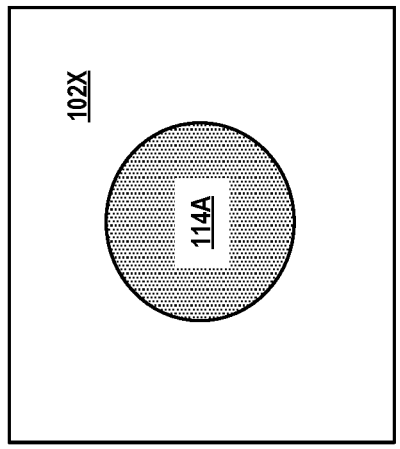

With reference to FIG. 6-8, as will be appreciated by those skilled in the art after a complete reading of the present application, when viewed in a cross-section taken through the high-resistivity plug 114A in a plane 113 (see FIG. 5) that is substantially parallel to the back surface 102X of the base semiconductor layer 102A, the high-resistivity plugs 114A may have any desired configuration, e.g., substantially circular (see FIG. 6), substantially rectangular (see FIG. 7), irregular (see FIG. 8), substantially square (not shown), etc. In one illustrative embodiment, the configuration of the high-resistivity plugs 114A may substantially correspond to the configuration of the regions in the FEOL structures 104 that contain RF circuits. Of course, the configuration of all of the high-resistivity plugs 114A need not be the same, but that may be the case in some applications.

Figure 9:
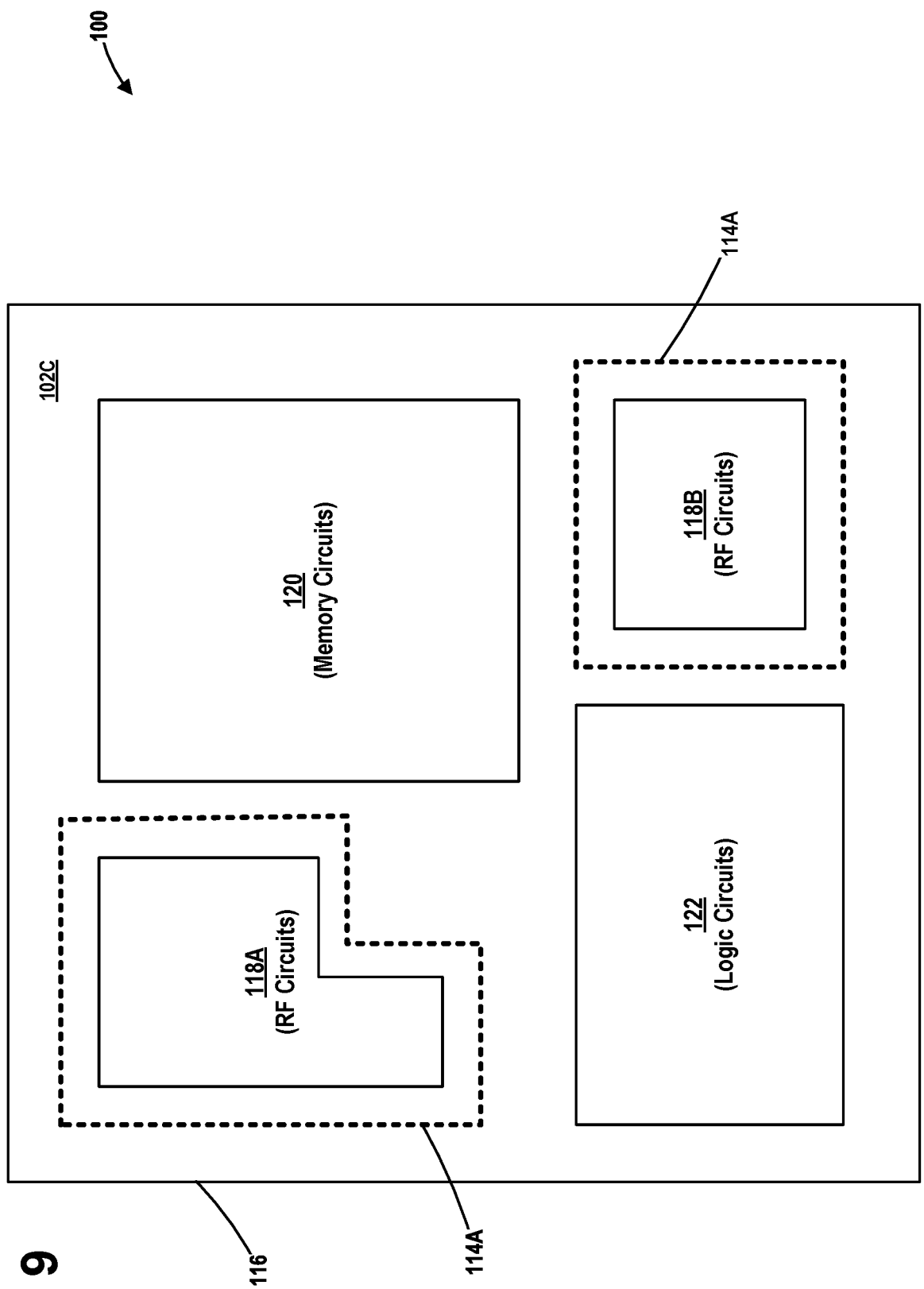

FIG. 9 is a simplistic depiction of an IC product 100 that comprises a die 116 (or chip) after it has been singulated from the other die on the overall substrate 102. FIG. 9 also simplistically depicts different regions where different types of circuits are formed above the active semiconductor layer 102C of the substrate 102. In this simplistic depiction, the die 116 comprises first and second regions 118A and 118B (collectively referenced using the numeral 118) that include RF circuits, a memory region 120 that includes memory circuits and a logic region 122 that includes logic circuits. Of course, the IC product 100 may contain other types of circuits and some of these regions are in other regions on the IC product 100. Moreover, the regions 118 that comprise RF circuits need not only have RC circuits formed therein, but that may be the case in some applications. That is, the regions 118 may contain circuits other than RF circuits. In other applications, the RF circuits on the IC product may not all be formed in a discrete and separate region. In that case, the high-resistivity plugs 114A may be formed under individual RF circuits as well as regions containing such RF circuits (if there are such regions on the IC product). FIG. 9 also depicts the outline, in dashed lines, of the high-resistivity plugs 114A that are formed in the base semiconductor layer 102A under the regions 118. As depicted, in this embodiment, the high-resistivity plugs 114A generally have a configuration that corresponds to that of the overlying regions 118, e.g., the first region 118A and the high-resistivity plug 114A underlying the region 118A have a generally irregular configuration, while the second region 118B and the high-resistivity plug 114A underlying the region 118B have a generally rectangular configuration. If desired, a simple rectangular shaped high-resistivity plug 114A could have been formed under the region 118A having the generally irregular configuration.

In terms of relative size of the "foot-prints" or areas of, when viewed from above, the underlying high-resistivity plug 114A will generally have a footprint (or area) that is substantially equal to or greater than the footprint (or area) of the region 118 under which the high-resistivity plug 114A is positioned. That is, with reference to FIGS. 5 and 9, in a first plane 113 that is substantially parallel to an upper surface 102Y of the active semiconductor layer 102C, the region of localized high resistivity, i.e., the high-resistivity plug 114A, has a first area while, in a second plane 113 that is substantially parallel to the upper surface 102Y of the active semiconductor layer 102C, the first region 118A that comprises the RF integrated circuits has a second area, wherein the first area is greater than the second area. In one illustrative embodiment, when viewed from above, the area of the high-resistivity plug 114A may be about 10% greater than the area of the region 118 under which the high-resistivity plug 114A is positioned.

Figure 10:
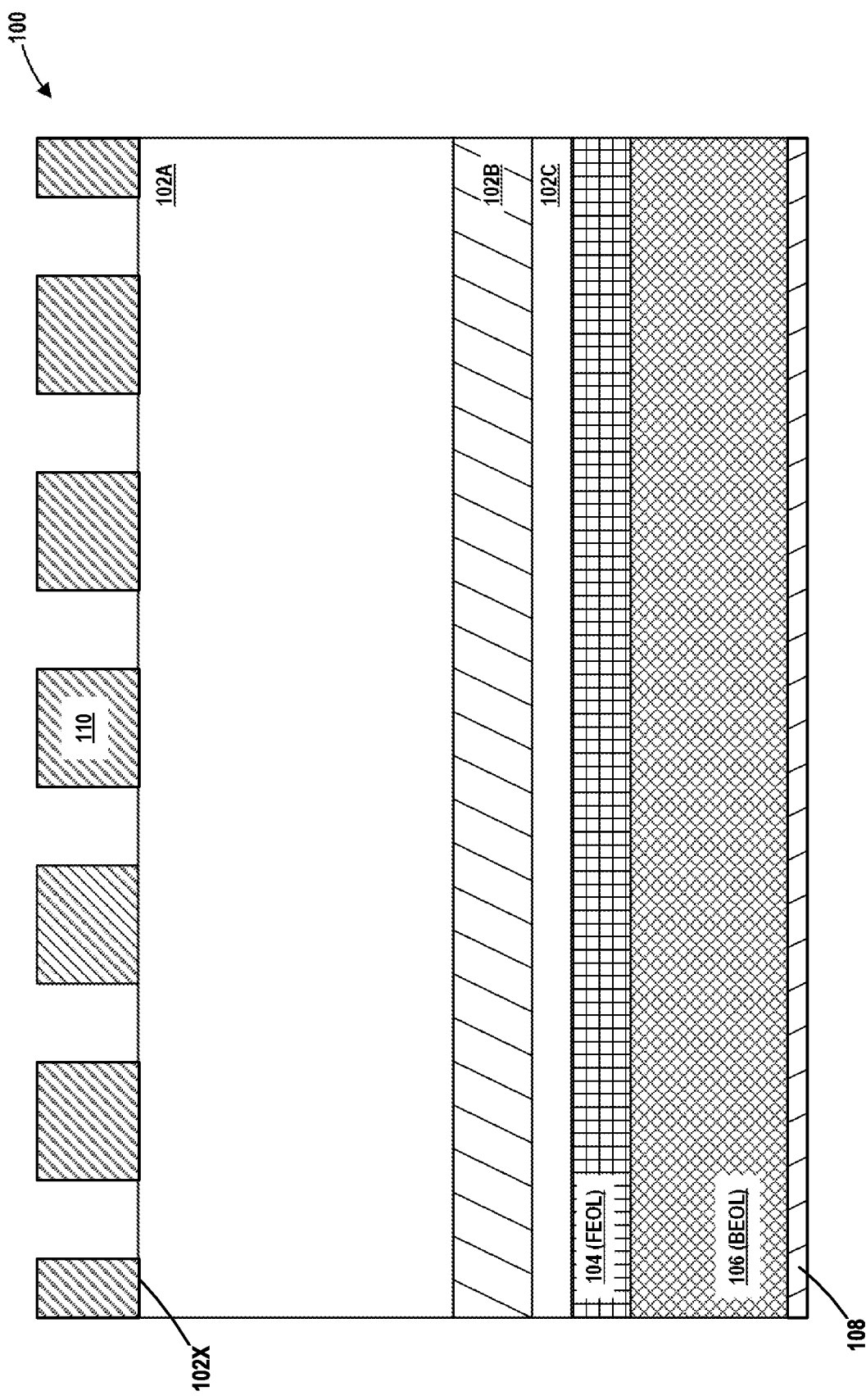

FIGS. 10-14 depict another illustrative method of forming localized regions of high resistivity in the base semiconductor layer 102A of the substrate 102. FIG. 10 depicts the IC product 100 at a point in fabrication that corresponds to that shown in FIG. 2, i.e., after the patterned etch mask 110 was formed above the back surface 102X of the base semiconductor layer 102A.

Figure 11:
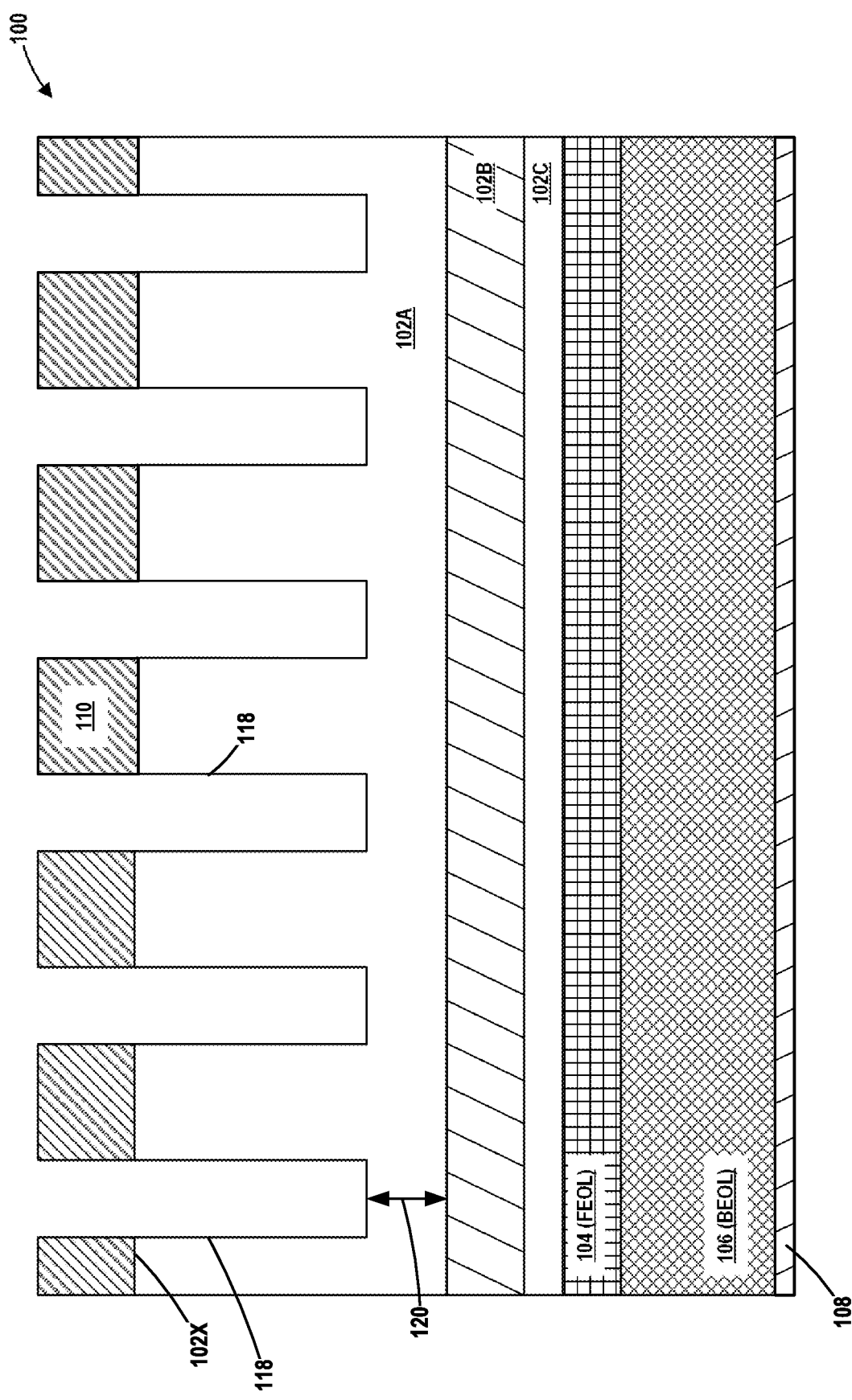

FIG. 11 depicts the IC product 100 after an etching process, e.g., an anisotropic etching process, was performed to form a plurality of openings 118 in the base semiconductor layer 102A. As depicted, in this example, the openings 118 do not extend all the way through the base semiconductor layer 102A. Rather, a residual thickness 120 of the base semiconductor layer 102A remains under each of the openings 118. The magnitude of the residual thickness 120 may vary depending upon the particular application, e.g., 100-500 nm. Similar to the openings 112 discussed above, the size, shape and configurations of the openings 118 may vary depending upon the particular application. As before, the size, shape and configurations of the openings 118 may vary depending upon the location and configuration of the regions on the IC product that contain the RF circuits, and the openings 118 may have the configuration of the above-described openings 112.

Figure 12:
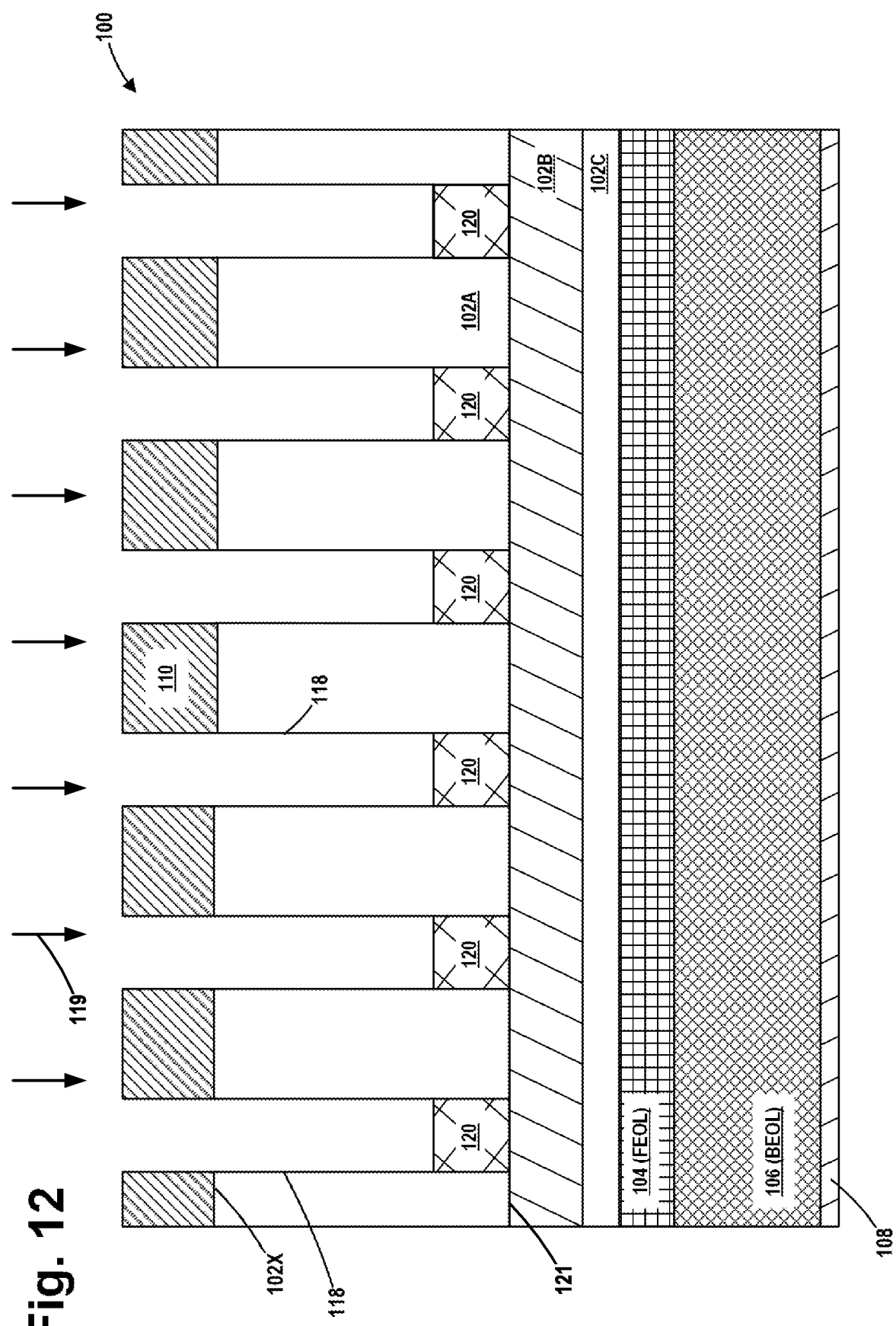

In one illustrative example, the material of the base semiconductor layer 102A has a crystalline lattice structure. FIG. 12 depicts the IC product 100 after an ion implantation process 119 was performed to create a damaged region 120 in the material of the base semiconductor layer 102A positioned below each of the openings 118 adjacent an interface 121 between the base semiconductor layer 102A and the buried insulation layer 102B. In effect, the ion implantation process 119 damages the crystalline structure of the material of the base semiconductor layer 102A. The damaged regions 120 have a damaged lattice structure that leads to higher trap density in the bandgap. It is different than the crystalline lattice structure of the non-implanted regions of the base semiconductor layer 102A. Due to the damaged lattice structure, the damaged regions 120 have a higher electrical resistivity than the electrical resistivity of the material of the base semiconductor layer 102A. The damaged regions 120 may be amorphized regions of the material of the base semiconductor layer 102A. The damaged regions 120 constitute localized regions of relatively high resistivity within the base semiconductor layer 102A. The damaged regions 120 will be formed in the base semiconductor layer 102A at various locations across the base semiconductor layer 102A, i.e., below the location of the regions of RF circuits formed in the FEOL structures 104 formed above the active semiconductor layer 102C. As with the high-resistivity plugs 114A discussed above, the damaged regions 120 may be of any desired configuration and they may substantially conform to the configuration of the overlying region of integrated circuits. As with the high-resistivity plugs 114A discussed above, the damaged regions 120 on any particular IC product 100 need not all have the same configuration, but that may be the case in some applications. The type of atoms implanted, the dosage of such atoms and the implant energy used during the ion implantation process 119 may all vary depending upon the particular application. In one illustrative embodiment, the ion implantation process 119 may be performed using an electrically neutral species, like argon, silicon, germanium, carbon, etc., with a dosage that falls within the range of about 1E14-1E15 atoms/cm$^2$ and at an energy level that falls with the range of about 1-1000 keV.

Figure 13:
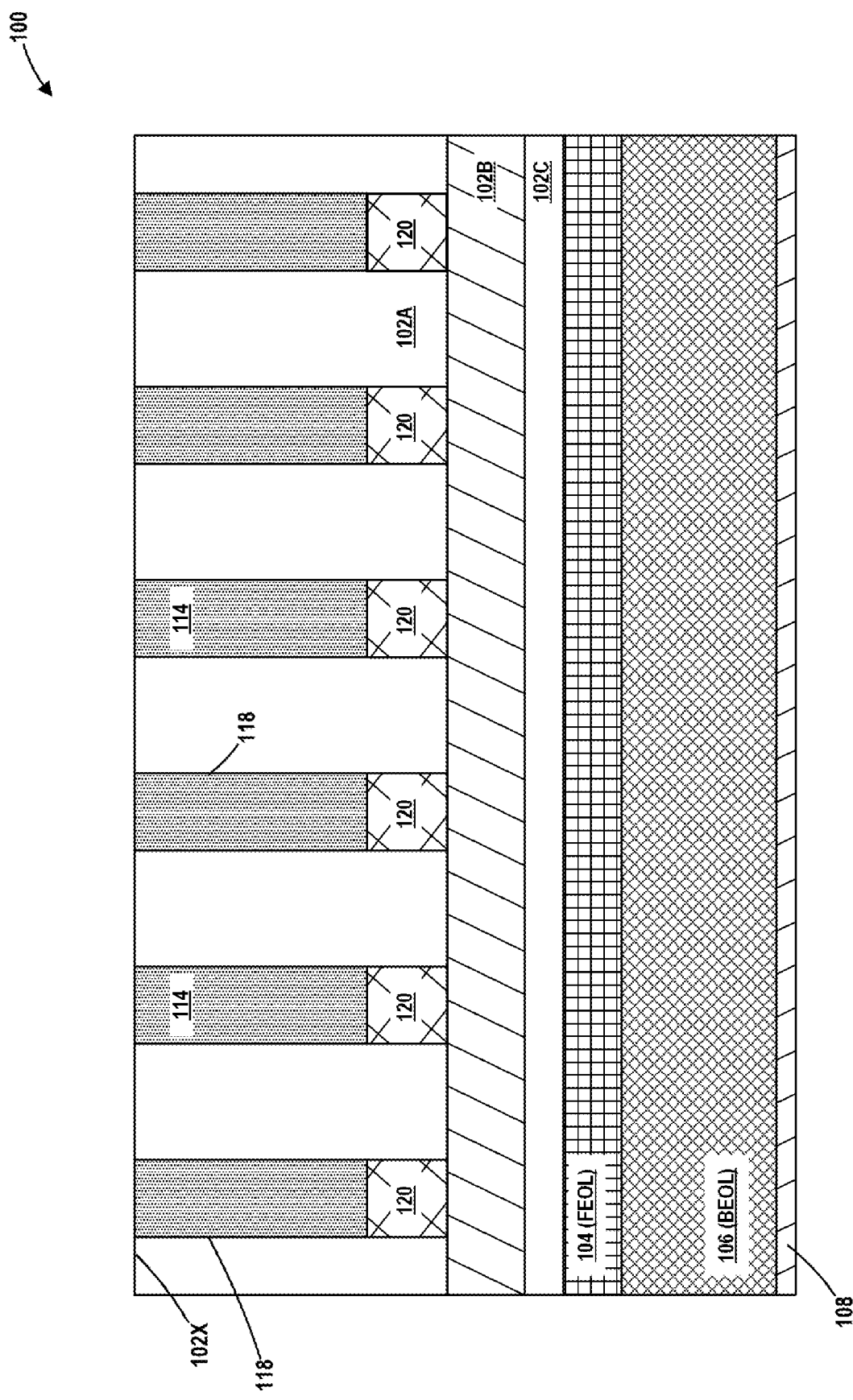

FIG. 13 depicts the IC product 100 after several steps were performed. First, the patterned etch mask layer 110 was removed. Thereafter, the above-described layer of insulating material 114 was blanket-deposited on the IC product 100, by performing, for example, a CVD process. The layer of insulating material substantially overfills the openings 118. Next, a planarization process, e.g., a CMP and/or an etch-back process operation, was performed to remove portions of the layer of insulating material 114 positioned outside of the openings 118. This process operation exposes the bottom surface 102X of the base semiconductor layer 102A. Note that openings 118—that are filled with an insulating material—extend from the back surface 102X of the base semiconductor layer 102A to the damaged region 120 in the base semiconductor layer 102A.

Figure 14:
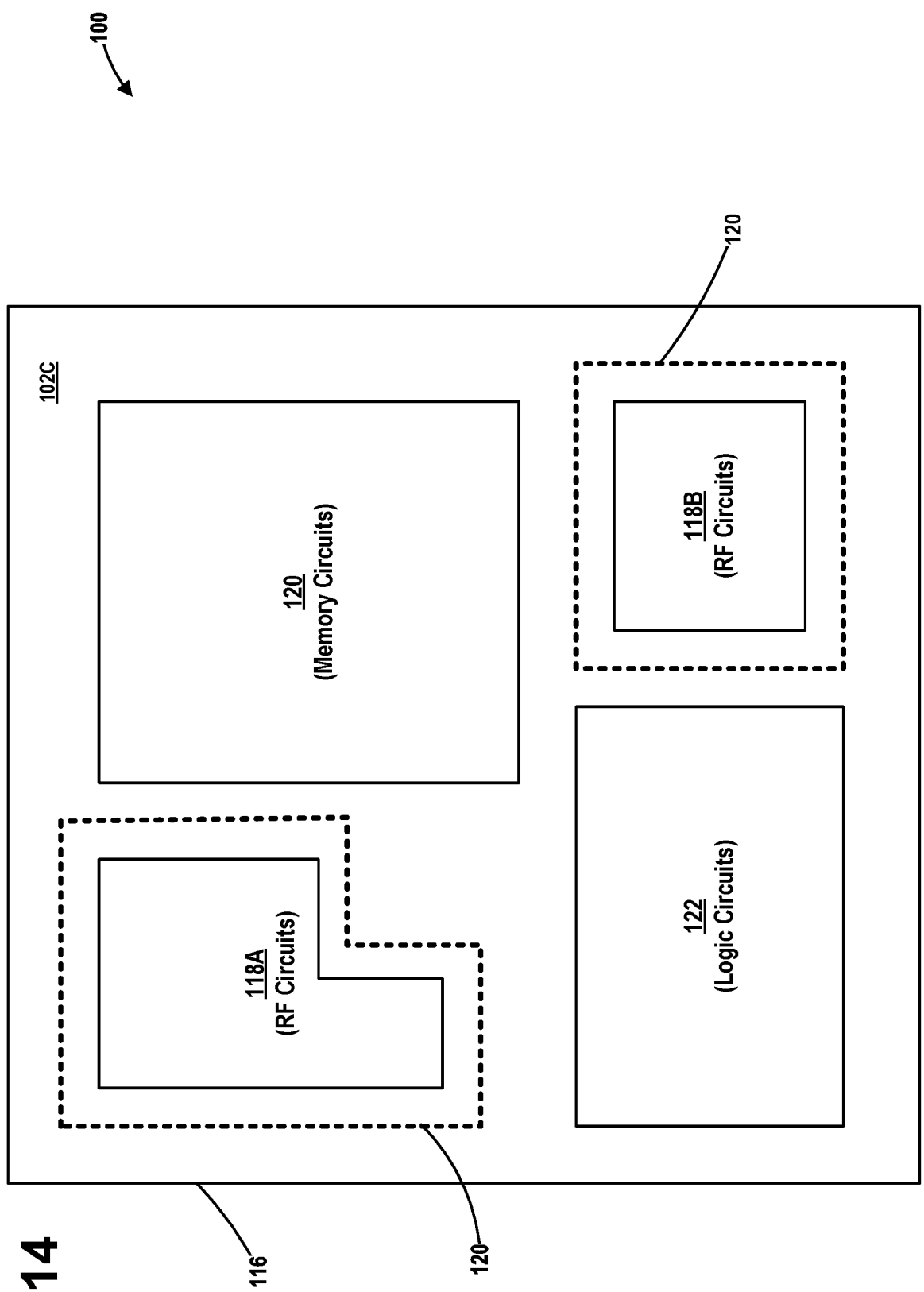

FIG. 14 is the same as FIG. 9 above except that FIG. 14 reflects the formation of the damaged regions 120 in the base semiconductor layer 102A below the regions 118 that contain RF circuits.

As noted above, both the high-resistivity plugs 114A and the damaged regions 120 constitute localized regions of relatively high resistivity within the base semiconductor layer 102A. These regions are localized in the sense that the base semiconductor layer 102A comprises at least one of the localized regions of relatively high resistivity, i.e., at least one of the high-resistivity plugs 114A or at least one of the damaged regions 120, while the remainder of the base semiconductor layer 102A remains in its original state or condition. In some applications, the base semiconductor layer 102A may contain one or more of the high-resistivity plugs 114A and one or more of the damaged regions 120. In one illustrative embodiment, the high-resistivity plugs 114A and the damaged regions 120 are localized regions of high resistivity that have a greater resistivity than the resistivity of the material of the base semiconductor layer 102A. In one illustrative embodiment, where the base semiconductor layer 102A is silicon and the insulating material 114 is silicon dioxide, the high-resistivity plugs 114A may have a resistivity that is at least about 10E3 times greater than the resistivity of the base semiconductor layer 102A. The combination of the damaged regions 120 and the insulation material 114 positioned in the openings 118 may have a resistivity that is about the same as that of the high-resistivity plugs 114A and, in addition, due to the damaged regions 120 with trap layers therein, devices and circuits formed above such regions, especially high-frequency devices and circuits, may exhibit better performance.

Additionally, in the depicted embodiment, the high-resistivity plugs 114A and the damaged regions 120 were formed in the base semiconductor layer 102A after all FEOL and BEOL processing operations were completed. However, the high-resistivity plugs 114A and the damaged regions 120 may be formed at any desired point in time. For example, in one embodiment, the high-resistivity plugs 114A and/or the damaged regions 120 may be formed in the base semiconductor layer 102A prior to performing any FEOL activities or structures, although such an approach would mean that the high-resistivity plugs 114A and the damaged regions 120 would be subjected to some FEOL processing operations, such as one or more high-temperature anneal processes. If the damaged regions 120 are subjected to such anneal processes, then at least some portion of the damaged regions 120 would be "healed" during the anneal process, i.e., at least some portion of the damaged regions 120 would revert back to their crystalline structure, thereby defeating the purpose of damaged regions. Additionally, if the high-resistivity plugs 114A and/or the damaged regions 120 were formed in the base semiconductor layer 102A prior to beginning FEOL activities, then additional process steps may be required when forming integrated circuits above the localized regions of relatively high resistivity.

As will be appreciated by those skilled in the art after a complete reading of the present application, the recitation that a region 118 of integrated circuits formed on the IC product 100 is positioned "above" a region of high resistivity 114A, 120 is a relative reference used to describe relative positional relationships between two structures or regions and not an absolute reference as to the positional relationship. That is, as used herein and in the attached claims, the use of a relative positional reference term like "above" should be understood to cover the situation where the IC product 100 is packaged in such a way that the bottom surface 102X of the base semiconductor layer 102A is facing vertically downward as well as the situation where the IC product 100 is packaged in such a way that the bottom surface 102X of the base semiconductor layer is facing vertically upward. The same applies in cases where the word "below" may be used to describe relative positional relationships between two structures or regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit (IC) product, comprising:
   a semiconductor-on-insulator (SOI) substrate comprising a base semiconductor layer, a buried insulation layer positioned above the base semiconductor layer and an active semiconductor layer positioned above the buried insulation layer;
   a first region of localized high resistivity formed in the base semiconductor layer, the first region of localized high resistivity having an electrical resistivity that is greater than an electrical resistivity of a material of the base semiconductor layer; and
   a first region comprising integrated circuits formed above the active semiconductor layer, wherein the first region comprising integrated circuits is positioned vertically above the first region of localized high resistivity in the base semiconductor layer.

2. The IC product of claim 1, wherein the first region of localized high resistivity comprises an insulating material positioned within an opening in the base semiconductor layer.

3. The IC product of claim 2, wherein the opening in the base semiconductor layer extends from a back surface of the base semiconductor layer to an interface between the base semiconductor layer and the buried insulation layer.

4. The IC product of claim 2, wherein the insulating material comprises one of silicon dioxide, silicon nitride, a high-k material (a material having a k value of about 7.0 or greater), $HfO_x$, $Al_2O_3$, $Ta_2O_5$, $TiO_2$, $BASrTiO_3$, $BzF_2$, $CaF_2$ or $SrF_2$, the base semiconductor layer comprises silicon, the buried insulation layer comprises silicon dioxide and the active semiconductor layer comprises silicon.

5. The IC product of claim 1, wherein the material of the base semiconductor layer has a crystalline lattice structure and wherein the first region of localized high resistivity comprises a damaged region of the base semiconductor layer adjacent an interface between the base semiconductor layer with a damaged lattice structure that is different than the crystalline lattice structure.

6. The IC product of claim 5, further comprising an opening in the base semiconductor layer, wherein the opening extends from a back surface of the base semiconductor layer to the damaged region of the base semiconductor layer and wherein the opening is filled with insulating material.

7. The IC product of claim 1, wherein the first region comprising integrated circuits comprises RF integrated circuits.

8. The IC product of claim 1, wherein, when viewed in a cross-section taken through the first region of localized high resistivity and a first plane that is substantially parallel to an upper surface of the active semiconductor layer, the first region of localized high resistivity has one of a substantially circular, a substantially rectangular, a substantially square or an irregular configuration.

9. The IC product of claim 1, wherein, in a first plane that is substantially parallel to an upper surface of the active semiconductor layer, the first region of localized high resistivity has a first area and, in a second plane that is substantially parallel to the upper surface of the active semiconductor layer, the first region comprising integrated circuits has a second area, wherein the first area is greater than the second area.

10. The IC product of claim 1, wherein, in a first plane substantially parallel to an upper surface of the active semiconductor layer, the first region of localized high resistivity has a first area and, in a second plane that is substantially parallel to the upper surface of the active semiconductor layer, the first region comprising integrated circuits has a second area, wherein the first area is substantially the same as the second area.

11. The IC product of claim 1, wherein the electrical resistivity of the first region of localized high resistivity is at least about 10E3 times greater than the electrical resistivity of the material of the base semiconductor layer.

12. The IC product of claim 1, further comprising:
a second region of localized high resistivity formed in the base semiconductor layer, the second region of localized high resistivity having an electrical resistivity that is greater than an electrical resistivity of the material of the base semiconductor layer, the second region of localized high resistivity being spaced apart from the first region of localized high resistivity; and
a second region comprising integrated circuits formed above the active semiconductor layer, wherein the second region comprising integrated circuits is positioned vertically above the second region of localized high resistivity in the base semiconductor layer.

13. An integrated circuit (IC) product, comprising:
a semiconductor-on-insulator (SOI) substrate comprising a base semiconductor layer, a buried insulation layer positioned on the base semiconductor layer and an active semiconductor layer positioned on the buried insulation layer;
a first region of localized high resistivity formed in the base semiconductor layer, the first region of localized high resistivity having an electrical resistivity that is greater than an electrical resistivity of a material of the base semiconductor layer, wherein the first region of localized high resistivity comprises an insulating material positioned within an opening in the base semiconductor layer; and
a first region comprising integrated circuits formed above the active semiconductor layer, wherein the first region comprising integrated circuits is positioned vertically above the first region of localized high resistivity in the base semiconductor layer and wherein, in a first plane substantially parallel to an upper surface of the active semiconductor layer, the first region of localized high resistivity has a first area and, in a second plane that is substantially parallel to the upper surface of the active semiconductor layer, the first region comprising integrated circuits has a second area, wherein the first area is substantially equal to or greater than the second area.

14. The IC product of claim 13, wherein the first region comprising integrated circuits comprises RF integrated circuits.

15. The IC product of claim 13, wherein the electrical resistivity of the first region of localized high resistivity is at least about 10E3 times greater than the electrical resistivity of the material of the base semiconductor layer.

16. The IC product of claim 13, wherein the opening in the base semiconductor layer extends from a back surface of the base semiconductor layer to an interface between the base semiconductor layer and the buried insulation layer.

17. An integrated circuit (IC) product, comprising:
a semiconductor-on-insulator (SOI) substrate comprising a base semiconductor layer, a buried insulation layer positioned on the base semiconductor layer and an active semiconductor layer positioned on the buried insulation layer, the base semiconductor layer comprising a material having a layer having a crystalline lattice structure and an electrical resistivity;
a first region of localized high resistivity formed in the base semiconductor layer, the first region of localized high resistivity having an electrical resistivity that is greater than the electrical resistivity of the material of the base semiconductor layer, wherein the first region of localized high resistivity comprises a damaged region of the base semiconductor layer adjacent an interface between the base semiconductor layer, the damaged region having a damaged lattice structure that is different than the crystalline lattice structure; and
a first region comprising integrated circuits formed above the active semiconductor layer, wherein the first region comprising integrated circuits is positioned vertically above the first region of localized high resistivity in the base semiconductor layer and wherein, in a first plane substantially parallel to an upper surface of the active semiconductor layer, the first region of localized high resistivity has a first area and, in a second plane that is substantially parallel to the upper surface of the active semiconductor layer, the first region comprising integrated circuits has a second area, wherein the first area is substantially equal to or greater than the second area.

18. The IC product of claim 17, further comprising an opening in the base semiconductor layer, wherein the opening extends from a back surface of the base semiconductor layer to the damaged region of the base semiconductor layer, wherein the opening is filled with insulating material.

19. The IC product of claim 17, wherein the first region comprising integrated circuits comprises RF integrated circuits.

20. The IC product of claim 17, wherein the electrical resistivity of the first region of localized high resistivity is at least about 10E3 times greater than the electrical resistivity of the material of the base semiconductor layer.

* * * * *